United States Patent [19]

Higgs

[11] Patent Number: 4,705,964
[45] Date of Patent: Nov. 10, 1987

[54] INTEGRATED CIRCUIT HALL SWITCH WITH ADJUSTABLE OPERATE POINT

[75] Inventor: Jacob K. Higgs, Salisbury, N.H.

[73] Assignee: Sprague Electric Company, North Adams, Mass.

[21] Appl. No.: 912,709

[22] Filed: Sep. 29, 1986

[51] Int. Cl.$^4$ .................. H01H 36/00; H01L 43/06
[52] U.S. Cl. ................................. 307/278; 307/309; 307/310; 330/6
[58] Field of Search ............ 307/278, 290, 309, 310; 357/51; 330/6

[56] References Cited

U.S. PATENT DOCUMENTS

| | | | |
|---|---|---|---|
| 3,671,767 | 6/1972 | Davis | 307/309 |
| 3,816,766 | 6/1974 | Anselmo et al. | 307/278 |
| 3,930,304 | 1/1976 | Keller et al. | 357/51 |
| 4,134,030 | 1/1979 | Pace | 307/309 |
| 4,210,996 | 7/1980 | Amemiya et al. | 357/51 |
| 4,218,626 | 8/1980 | Fukuda et al. | 307/309 |
| 4,296,410 | 10/1981 | Higgs et al. | 307/309 |
| 4,443,716 | 4/1984 | Avery | 307/309 |

Primary Examiner—John S. Heyman

[57] ABSTRACT

A silicon integrated circuit has a Hall-element, a differential amplifier and a Schmitt trigger circuit connected in tandem to form a Hall switch. It is demonstrated that only one set of component parameters, e.g. resistor values, exists that provides an optimally smooth temperature coefficient (TC) of Hall-switch operate-point. It is further shown that by adding an adjustable resistor from the Schmitt trigger circuit ground, which resistor has the same resistivity and TC as does the Hall element, adjustment of the operate-point to another particular operate-point is accomplished without substantially altering the above-noted optimum TC. Operate-point adjustment, e.g. by blowing fuse links, during manufacturing, at probe, can be effected to yield a narrow distribution of operate-points conforming to a customer specification.

11 Claims, 5 Drawing Figures

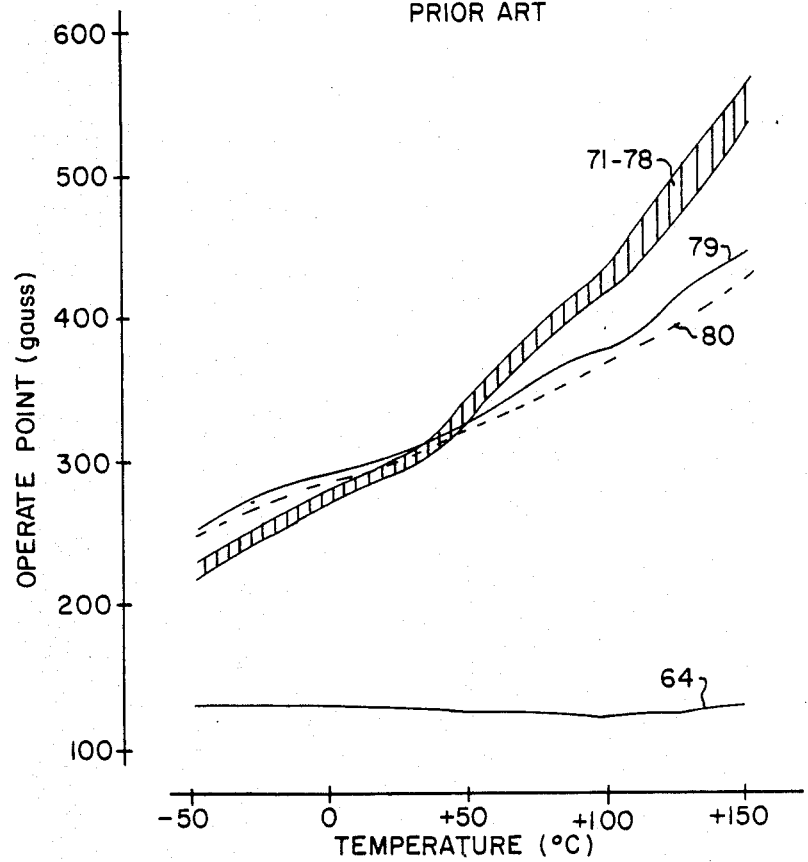
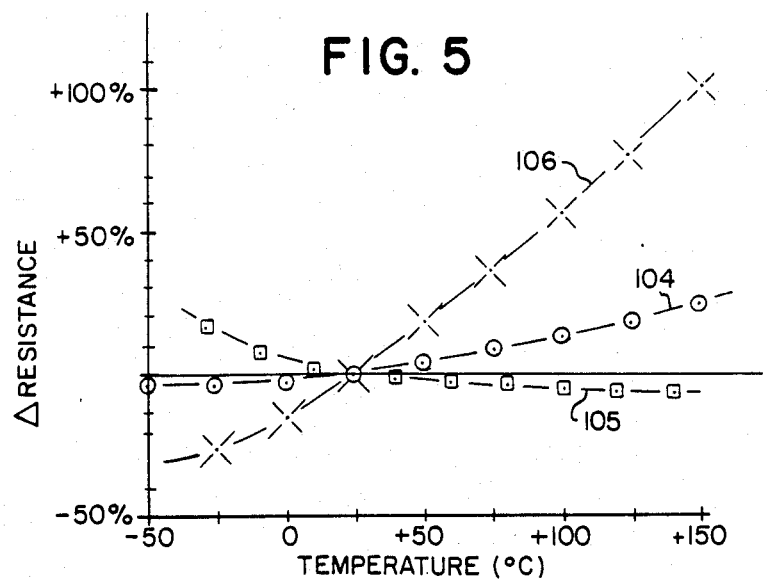

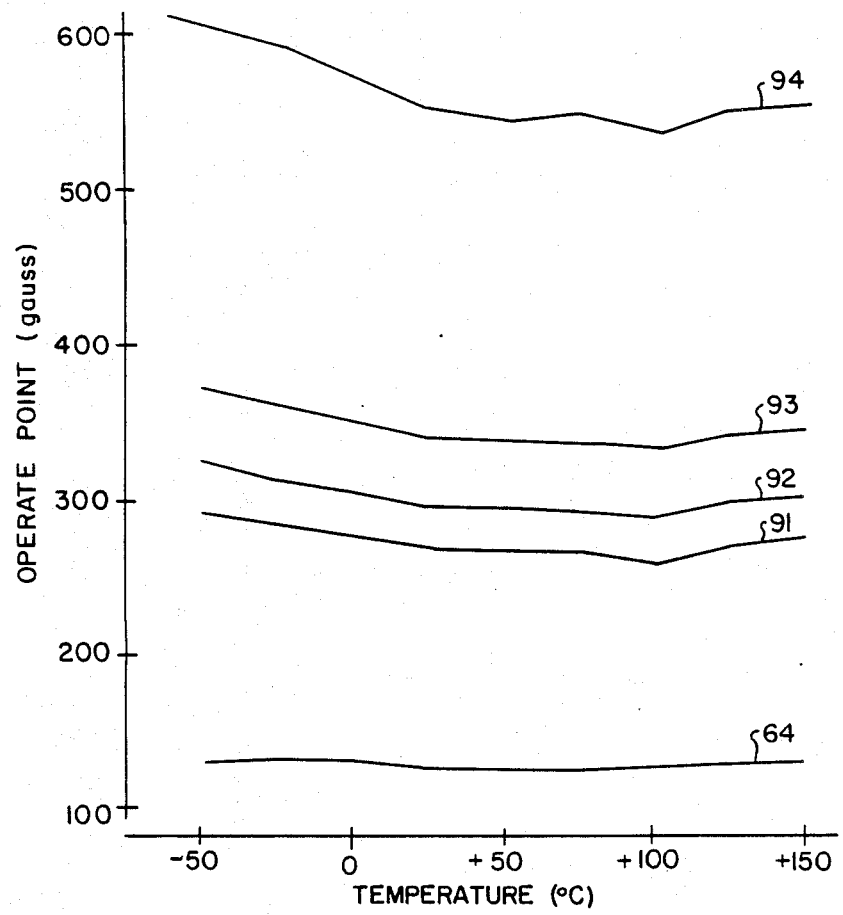

INTEGRATED CIRCUIT HALL SWITCH WITH ADJUSTABLE OPERATE POINT

BACKGROUND OF THE INVENTION

This invention relates to a silicon integrated circuit including a Hall cell followed by an amplifier and a Schmitt trigger circuit and more particularly to a means for adjusting the operate and release points without substantially altering the variation of those points as a function of temperature.

Integrated circuits including Hall elements are well known. In a silicon integrated circuit the Hall element has a low sensitivity, and other portions of the IC usually contain a differential amplifier for amplifying the low value output voltage from the two sensing or output contacts of the Hall element. In the patent to Anselmo and Genesi U.S. Pat. No. 3,816,766 issued June 11, 1974 and assigned to the same assignee as the present invention, there is described an integrated circuit Hall switch including a Hall element, a Hall voltage amplifier and a Schmitt trigger circuit. This patent describes an approach to circuit design for achieving in a Hall switch a smooth coefficient of the switching or operate-point as a function of temperature. However, it is very difficult to manufacture such Hall switches with predictable operate-points.

It is therefore an object of the present invention to provide integrated circuit Hall switches having a predictable operate-point to within a close tolerance.

SUMMARY OF THE INVENTION

An integrated circuit Hall switch has a Hall element, a differential amplifier having a differential voltage output and a Schmitt trigger circuit having a differential voltage all connected in tandem. Electrical energy is supplied to the Hall Element, the amplifier and the Schmitt circuit via a DC voltage bus and a ground bus. An adjustable resistor is connected between one side of the output of the amplifier and the ground bus which resistor is then capable of changing the operate-point of the Hall switch.

The adjustable resistor may take the form of a plurality of series connected resistors all but one of which has a severable link connected in parallel with it. Adjustment of the operate-point may be made during manufacture at the stage of electrically probing each Hall switch die on a wafer of many die and severing the appropriate of such links to obtain a desired operate-point.

The addition of an adjustable resistor according to this invention provides a means for adjusting the operate-point that produces a less severe concomitant change in the temperature coefficient (TC) of operate-point, compared with other possible approaches. Such other ways include the most obvious such as changing the resistor values in the amplifier and/or in the Schmitt circuit.

Furthermore, it has been discovered that when such an adjusting resistor is of the same material, e.g. epitaxial material, as is the Hall element and thus their temperature coefficients of resistance are the same, then the above-noted concomitant change is the temperature coeffecient of operate-point is minimized.

BRIEF DESCRIPTION OF THE DRAWINGS

FIG. 3 shows a graph of operating points as a function of temperature for Hall switches of the prior art.

FIG. 4 shows a graph of operate-points for Hall switches of this invention.

FIG. 5 shows a graph of the change in resistance of resistor as a function of temperature for resistors in the integrated circuit of FIG. 1.

DESCRIPTION OF THE PREFERRED EMBODIMENT

Figures 1, 2:
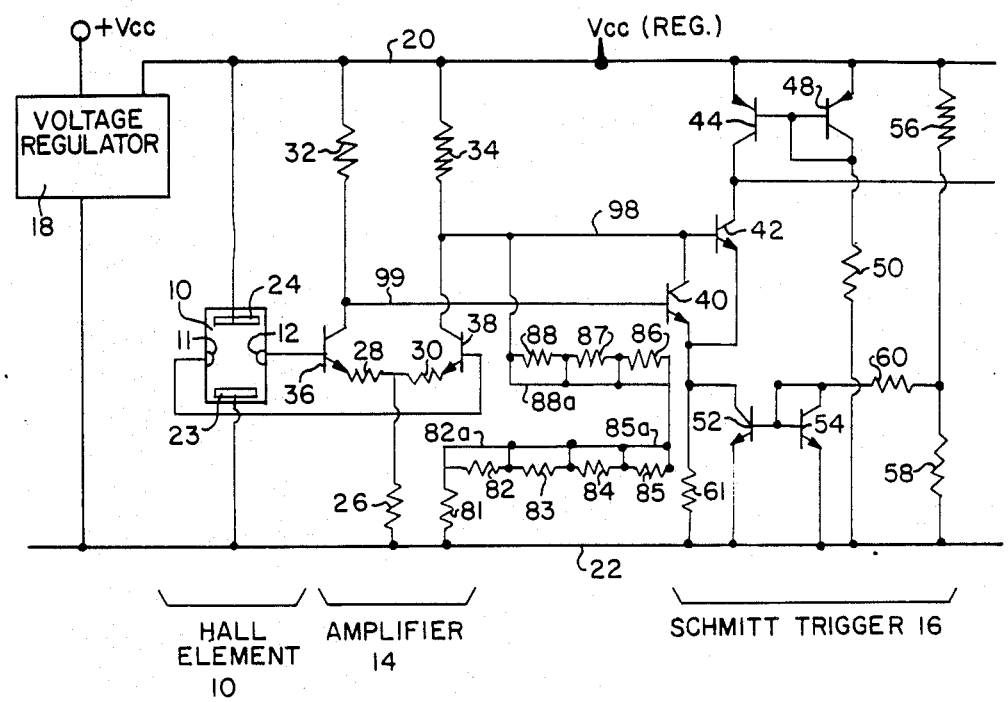
FIG. 1 shows a circuit diagram of an integrated circuit Hall switch of this invention.
FIG. 2 shows in side sectional view a portion of the integrated circuit of FIG. 1 including two epitaxial resistors.

An integrated circuit as shown in FIG. 1 has a Hall element 10 with output pads 11 and 12 connected to the input of a differential amplifier 14 that in turn has an output connected to the differential input of a Schmitt trigger circuit 16. A voltage regulator 18 provides a regulated supply voltage $V_{cc}$ (reg.) at bus 20 with respect to a ground bus 22. The Hall element power pads 23 and 24 are connected respectively to the two buses 22 and 20.

Amplifier 14 has a common emitter resistor 26, two branch emitter resistors 28 and 30 and two collector resistors 32 and 34 of near equal value. The amplifier output at the collectors of amplifier transistors 36 and 38 are connected respectively to the bases of Schmitt circuit transistors 40 and 42. A current source comprised of transistors 44 and 48 and resistor 50 supplies current from the regulated voltage bus 20 to the collector of transistor 42. A special temperature compensating current source, comprised of transistors 52 and 54 and resistors 56, 58 and 60, supply current to the commonly connected emitters of transistors 40 and 42 in shunt with emitter resistor 61.

This integrated circuit was made in a P-type silicon substrate by a standard bipolar process. Some features of that process include growing an N-type epitaxial layer of 3 ohm-centimeters per square from 10 to 12 microns thick. The Hall element 10 is formed in an isolated epitaxial pocket 62 as illustrated in FIG. 2 wherein the Hall body is epitaxial material.

Resistors 26, 28, 30, 32, 34 and 61 have a sheet resistivity of 135 ohms per square and were formed at the same time as were the bases of the transistors. The method includes a predeposition by a low energy ion implantation of $1.5 \times 10^{15}$ boron atoms/cm$^2$ to achieve well controlled resistor values. These are referred to herein as B & R resistors.

Resistors 56, 58 and 60 are polysilicon resistors made by a conventional process including ion implanting polysilicon with boron to achieve a sheet resistivity of 2000 ohms per square.

Prior to building this integrated circuit, a model of the circuit was developed whereby the operate and release points could be determined for any given combination of resistance values and as a function of temperature.

For a Hall switch such as this one, wherein the hysteresis loop is all for one polarity of the ambient magnetic field being sensed, the term "operate point" means the sensed magnetic field strength that is just large enough to cause the device to switch from a first state to a second state, and the term "release point" means the sensed ambient magnetic field strength at which the device switches back from the second to the first state. Release point is lower than operate point and the hysteresis is defined as the difference between them. For Hall switches having a symmetrical hysteresis loop, the operate and release points have different polarities.

With the aid of a computer and the above-mentioned model a combination of resistors was determined for which the operate point remained essentially constant with temperature from −50° C. to +150° C. Curve 64 in FIG. 3 is a plot of that most stable operate point with temperature, and this combination of resistors is shown in Table 1 as Example 64.

TABLE 1

(Example 64)

| Resistor Numeral | Resistor Value (ohms) |
| --- | --- |
| 26 | 1000 |
| 28 | 100 |
| 30 | 100 |
| 32 | 2135 |
| 34 | 2000 |
| 61 | 20K |
| 50 | 30K |
| 60 | 12K |
| 56 | 8K |
| 58 | 1.3K |

The operate point at 25° C. is 126 gauss and varies no more than 7 gauss over the entire temperature range. For this combination of resistor values the Hall element 10 and amplifier 14 taken together produce an output voltage that varies substantially with temperature but the Schmitt trigger circuit, with its special combination of resistor values (Table 1), compensates to provide a near zero temperature coefficient of operate point (curve 64).

With this unique set of resistor values in Example 64 (given in Table 1) the value of one or two resistor values was changed with the aim of adjusting the operate point value without losing stability with temperature. An operate point of 300 gauss was sought. Table 2 below gives changed resistor values that resulted in an operate point of about 300 gauss.

TABLE 2

| Ex. # | Changed Resistors | | | | Resulting | |
| --- | --- | --- | --- | --- | --- | --- |
| | Numeral | Value (ohms) | Numeral | Value (ohms) | Operate Point | Hysteresis |
| 64 | reference | | | | 126 | 100 |
| 71 | 34 | 2110 | 61 | 21K | 303 | 95 |
| 72 | 32 | 2030 | 61 | 21K | 299 | 91 |
| 73 | 34 | 2095 | | | 299 | 110 |
| 74 | 32 | 2040 | | | 303 | 108 |
| 75 | 28 | 108 | | | 309 | 103 |
| 76 | 28 | 109 | 61 | 21K | 309 | 87 |
| 77 | 30 | 92 | | | 301 | 97 |
| 78 | | | 61 | 14.5K | 301 | 245 |

A thick line curve 71–78 includes the TC curve of each of examples 71 through 78. Note from FIG. 3 that in every example represented by the thick-line curve that about the same strong positive TC of operate-point resulted. Furthermore, the hysteresis changed radically from that of the reference Example 64.

In a further attempt (Example 79) to modify the reference circuit to achieve an operate point of 300 gauss without changing hysteresis and stability with temperature, the offset voltage (output at zero gauss) was changed from 0 to −0.0036 volts to give an operate point of 300 gauss. Hysteresis became 90 gauss and the TC of operate-point, curve 79 in FIG. 2, became strongly positive. In another attempt, the base-emitter area ratio between the two differential amplifier transistors 32 and 34 was changed from 1 to 1.15 with the result that the TC of operate-point, curve 80, was equally strong and the hysteresis was again 90 gauss.

It is concluded that there is only one unique set of resistor values for this circuit that provides a stable operate-point with temperature. It is a corrollary conclusion that there is only one unique temperature-stable operate-point level once the circuit and process are fixed.

In the above-described Examples 64 and 71 through 80 the resistors 81, 82, 83, 84, 85, 86, 87 and 88 are not present. Resistors 81 though 88 are added to make the Hall switch one of this invention. Resistors 81 through 88 are connected in series. The later seven of them are each shorted by a conductive link (82a through 88a) that is capable of being blown open (vaporized) electrically at probe or by other standard means.

Resistors 81 through 88 are each formed in a separate epitaxial pocket, the body being of epitaxial material. Contacts, e.g. 92 and 93, shown in FIG. 2 are conventional N+ contact regions.

In Table 3 there is given the total active value of the series resistors 91–94, the resulting operate-point, at 25° C., and the hysteresis at 25° C.

TABLE 3

| Example | Resistors 91-94 (ohms) | Opr. Pt. (gauss) | Hystr. (gauss) |
| --- | --- | --- | --- |
| 64 | 00 | 126 | 100 |
| 91 | 111K | 270 | 90 |
| 92 | 93K | 297 | 88 |
| 93 | 74K | 341 | 86 |
| 94 | 37K | 550 | 72 |

Referring to FIG. 4 there are shown the comparatively stable operate-point curves 91, 92, 93 and 94 associated with new room temperature operate-point values. Adjustment of operate-point by this series epitaxial-resistor means not only retains given stability with temperature but also changes the room temperature hysteresis only a small amount. And further yet, the temperature stability of the hysteresis is maintained.

In the above Examples 91 through 94, the upward adjustment of operate-points was achieved by connecting an epitaxial resistor between amplifier output conductor 98 and ground. Additional experiments with an epitaxial resistor connected between amplifier output conductor 99 and ground show that equally effective downward adjustment of operate-points with temperature stability can be made.

In a further experiment (Example 101) there was substituted in the Hall switch of Example 92 a B & R resistor of 93,000 ohms for the 93,000 ohm epitaxial adjusting resistor 61. The room temperature operate-point remained the same, of course, but the TC of the operate point, curve 101 in FIG. 3 became strongly positive.

The particular temperature characteristics of the three types of resistors used in the preferred embodiment are given in FIG. 5. Curves 104, 105 and 106 show the change of resistance as a function of temperature, respectively, of a B & R type resistor, a polysilicon resistor and an epitaxial resistor. However, the invention is not limited to using these particular resistors. Also, other Schmitt trigger circuit may be employed so long as they are designed to temperature compensate the combination of Hall element and amplifier.

It is preferred, however, to employ an epitaxial adjusting resistor (e.g. 81–88) when the Hall element body is epitaxial material; but more generally, the temperature coefficient of resistance of the adjusting resistor is preferably about the same as that of the Hall element body.

The operate-point adjusting feature of a Hall switch of this invention is particularly useful during Hall switch manufacture. As seen by some of the data presented herein, the operate-point of a Hall switch is very sensitive to changes in matching between paired components in the differential amplifier, dimensional assymetry in the Hall element itself and absolute values of certain resistors in the Schmitt trigger circuit. Control of these parameters during manufacture from wafer to wafer or from die to die within a wafer is never perfect and, therefore, the statistical spread of operate-points can be much larger than that most users for such Hall switches find useful. Thus, the adjustment of the adjustable resistor in each Hall switch die at the stage of wafer probe (at which the circuit is first electrified and its electrical performance is measured) is capable of producing Hall switches having a spread of operate-points within a tighter tolerance and without losing temperature stability. Thus it is practical for the first time for a manufacturer to standardize on a single design of the Hall switch die, and adjust the operate-point to any particular customer requirement.

What is claimed is:

1. An integrated circuit Hall switch comprising a Hall element, a differential amplifier having an input connected to the output of said Hall element and having a differential voltage output; a Schmitt trigger circuit having a differential voltage input connected to said output of said amplifier; a ground bus and a voltage supply bus for supplying electrical energy to said Hall element, said amplifier and said Schmitt trigger circuit; and an adjustable resistor connected, between one side of said output of said amplifier and said ground bus, by which the operate point of said Hall switch is adjustable.

2. The integrated circuit of claim 1 wherein the temperature coefficient of resistance of said adjustable resistor is essentially equal to the temperature coefficient of resistance of the body of said Hall element.

3. The integrated circuit of claim 1 wherein the semiconductor material of said resistor is the same as is the body of said Hall element.

4. The integrated circuit of claim 1 additionally comprising a silicon substrate of one conductivity type, an epitaxial layer of the opposite type grown over said one type substrate, the body of said Hall element and the body of said resistor being formed of respective separate portions of said epitaxial layer.

5. The integrated circuit of claim 1 wherein without said resistor said Schmitt trigger circuit has a switching characteristic with temperature that is complementary to the change in amplifier output voltage as a function of temperature for providng an optimally stable operate point of said Hall switch with temperature.

6. The integrated circuit of claim 1 wherein said adjustable resistor is comprised of a plurality of series connected resistors and severable conductive links respectively connected in parallel with each of said series connected resistors except at least one.

7. A process for adjusting the operate point of an integrated circuit Hall switch of the kind having a Hall element, a differential amplifier connected to the output of said Hall element, and a Schmitt trigger circuit having an input connected to the output of said amplifier, comprising adding resistance from said input of said Schmitt trigger circuit to the circuit ground point to obtain the desired operate point.

8. The process of claim 7 wherein said Schmitt trigger circuit input is a differential input, said amplifier output is a differential output, and said adding said resistance is accomplished by adding the resistance from one of the two conductors of said differential Schmitt trigger circuit input to the circuit ground point.

9. The process of claim 7 wherein said Hall switch additionally includes at least one resistor combined with a shorting conductive link in parallel with said resistor connected from said Schmitt trigger input to said ground point, and wherein said adding resistance is accomplished by severing said link.

10. The process of claim 9 wherein said severing is accomlished by vaporizing a portion of said link.

11. The process of claim 1 additionally comprising a voltage regulator having an output connected to said buses, said Hall element being connected directly across said buses.

* * * * *